United States Patent [19]

Cruz et al.

[11] Patent Number: 4,677,396
[45] Date of Patent: Jun. 30, 1987

[54] SURFACE MOUNTED COMPONENT UHF OSCILLATOR

[75] Inventors: Michael S. Cruz, Des Plaines; Harmon P. Vaughter, Evanston, both of Ill.

[73] Assignee: Zenith Electronics Corporation, Glenview, Ill.

[21] Appl. No.: 806,252

[22] Filed: Dec. 6, 1985

[51] Int. Cl.[4] .................... H03B 5/12; H05K 13/04
[52] U.S. Cl. .................... 331/117 R; 331/68; 331/117 D; 331/177 V; 29/739; 361/400
[58] Field of Search ............... 331/96, 117 R, 117 D, 331/177 V, 68; 334/15, 85; 29/739, 740, 741; 361/400, 403, 417, 418

[56] References Cited

U.S. PATENT DOCUMENTS

| | | | |
|---|---|---|---|
| 3,679,990 | 7/1972 | Hiday et al. | 331/117 D X |
| 3,909,726 | 9/1975 | Dobrovolny et al. | 455/150 |
| 4,139,881 | 2/1979 | Shimizu et al. | 361/400 |
| 4,515,304 | 5/1985 | Berger | 228/136 |
| 4,573,105 | 2/1986 | Beldavs | 29/831 X |
| 4,593,255 | 6/1986 | Matsuura | 331/117 R |

*Primary Examiner*—Siegfried H. Grimm

[57] ABSTRACT

A UHF oscillator circuit includes a plurality of first leadless, or "chip", surface mounted components machine positioned on a first side of a printed circuit (PC) board and a plurality of second lead-bearing components mounted on a second side of the PC board and coupled in circuit through the PC board to the chip components in an arrangement which substantially reduces circuit fabrication costs. Comprised of a majority of automatically positioned surface mounted chip components and making use of a minimum number of lead mounted discrete components, the low Q values of the surface mounted components are compensated for by an external surface mounted feedback capacitor coupled across the collector-emitter junction of a common base transistor to provide oscillator tuning over a frequency range greater than an octave.

4 Claims, 4 Drawing Figures

SURFACE MOUNTED COMPONENT UHF OSCILLATOR

BACKGROUND OF THE INVENTION

This invention relates generally to RF tunable circuits and is particularly directed to a low cost, wideband UHF oscillator circuit.

Leadless electronic components are gaining increased acceptance because of their small size and the ease with which they are automatically positioned in circuit by robotic component handling apparatus. The smaller size of these surface mounted, or "chip", components reduces circuit space requirements and relaxes thermal dissipation criteria. Electrical coupling of the ends of the leadless components to isolated conductive portions of a printed circuit (PC) board by soldering eliminates the precise positioning required in inserting component leads through apertures in the PC board as in the case of conventional discrete components. Automatic, high speed positioning of these surface mounted components eliminates the labor intensive mounting procedure associated with electronic components having leads, thus, substantially reducing the cost of PC board fabrication.

These surface mounted components, however, suffer from operating limitations in certain circuit applications. For example, chip capacitors inherently have a lower Q value than the more conventional type of capacitor with leads. In a tuned circuit this reduced Q value is frequently undesirable because of limitations in the bandwidth over which the circuit may be tuned. Thus, the advantages of surface mounted components in terms of reduced size and heat generation as well as ease of mounting and connecting in circuit in an RF receiver are frequently outweighed by their inherent operating limitations in a variably tuned circuit.

The present invention resolves the aforementioned problems encountered in the prior art by providing a UHF oscillator circuit comprised almost entirely of surface mounted devices which is capable of being tuned over a frequency range in excess of an octave.

OBJECTS OF THE INVENTION

Accordingly, it is an object of the present invention to provide a low cost, wideband local oscillator for a tunable RF circuit.

It is another object of the present invention to provide a UHF local oscillator circuit tunable over an octave comprised primarily of automatically positioned, surface mounted devices.

Yet another object of the present invention is to provide a high Q UHF local oscillator comprised primarily of low Q surface mounted components.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Figure 1:
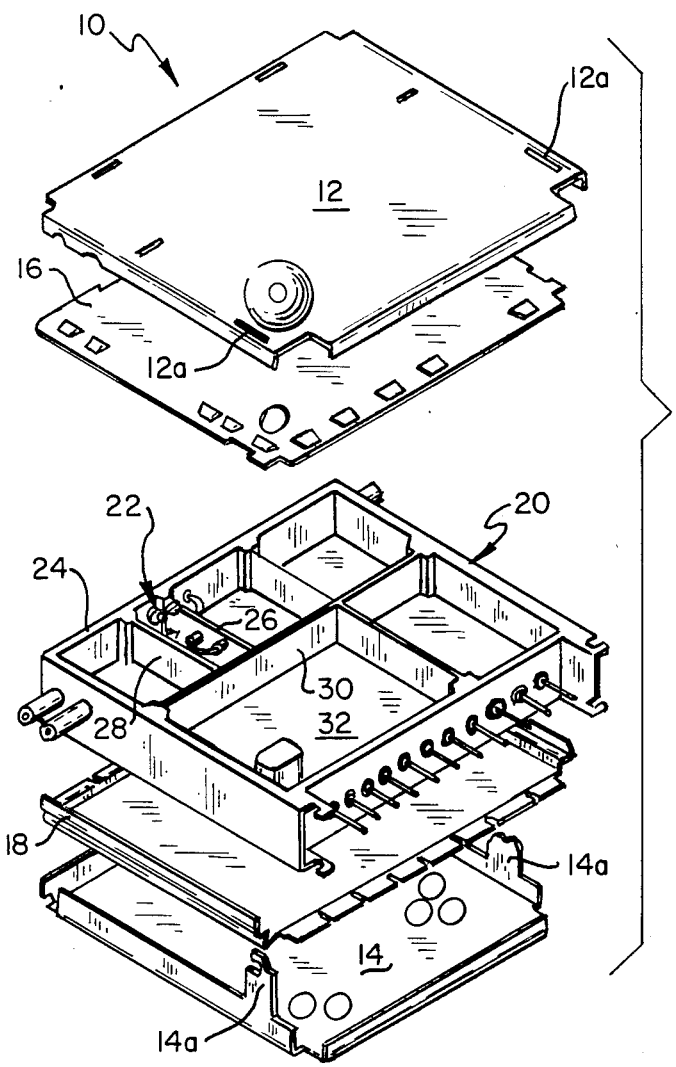
FIG. 1 is an exploded upper perspective view of an RF tuner incorporating a UHF oscillator circuit comprised primarily of surface mounted devices in accordance with the present invention.

Referring to FIG. 1, there is shown an exploded perspective view of an RF tuner 10 which includes a UHF local oscillator circuit in accordance with the present invention. The RF tuner 10 includes a top panel 12 having a plurality of elongated slots 12a adjacent to the periphery thereof. The RF tuner 10 further includes a bottom panel 14 having a plurality of coupling arms 14a extending upward therefrom adjacent to the periphery thereof. Each of the coupling arms 14a is adapted for insertion within a respective slot 12a in the top panel 12 for securely coupling the bottom panel 14 to the top panel in a spaced arrangement. Positioned intermediate the top panel 12 and the bottom panel 14 is a metal frame 20 which is sectioned off into various compartments as shown in the figure. Mounted to a lower portion of the metal frame 20 is a printed circuit (PC) board 32 upon which are positioned various electronic components and conductors. An upper RF shield 16 is positioned between the top panel 12 and an upper portion of the metal frame 20. Similarly, a lower RF shield 18 is positioned between the bottom panel 14 and a lower portion of the metal frame 20. When thus assembled, the metal frame and panels provide an enclosed structure within which are positioned the various electronic components which comprise the tuner circuitry.

The present invention is directed to a unique configuration for a UHF oscillator, a portion of the circuitry of which is positioned within an oscillator compartment 22 within the metal frame 20. The oscillator compartment 22 is defined by an outer wall 24, first and second intermediate walls 26, 28, and an inner wall 30 of the metal frame 20. The bottom portion of the oscillator compartment 22 is defined by an upper surface of the PC board 32, while an upper portion of the oscillator compartment is defined by the upper RF shield 16. The metal frame 20 as well as the top and bottom panels 12, 14 are preferably comprised of metal for rigidity and strength. The upper and lower RF shields 16, 18 are preferably comprised of a highly conductive metal to prevent the escape of electromagnetic radiation from the tuner housing.

Figure 3:
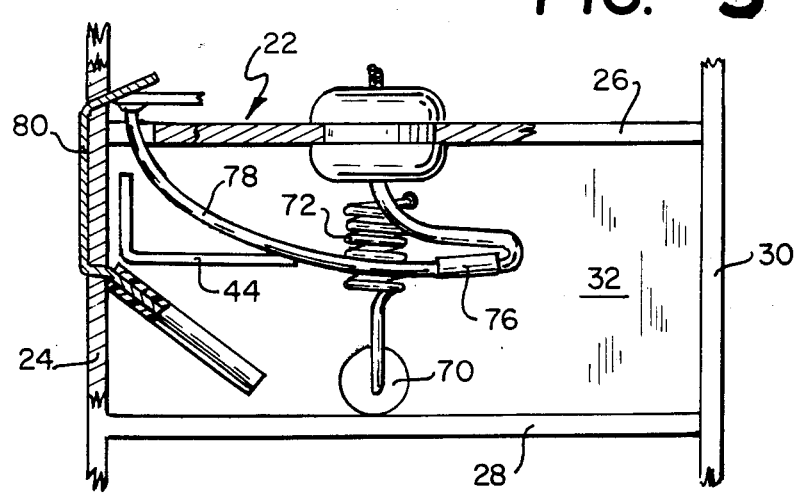
FIG. 3 is a planar view of a first side of a printed circuit board including an oscillator compartment thereon within which are positioned several discrete lead-bearing components used in the UHF oscillator of the present invention.
Figure 2:
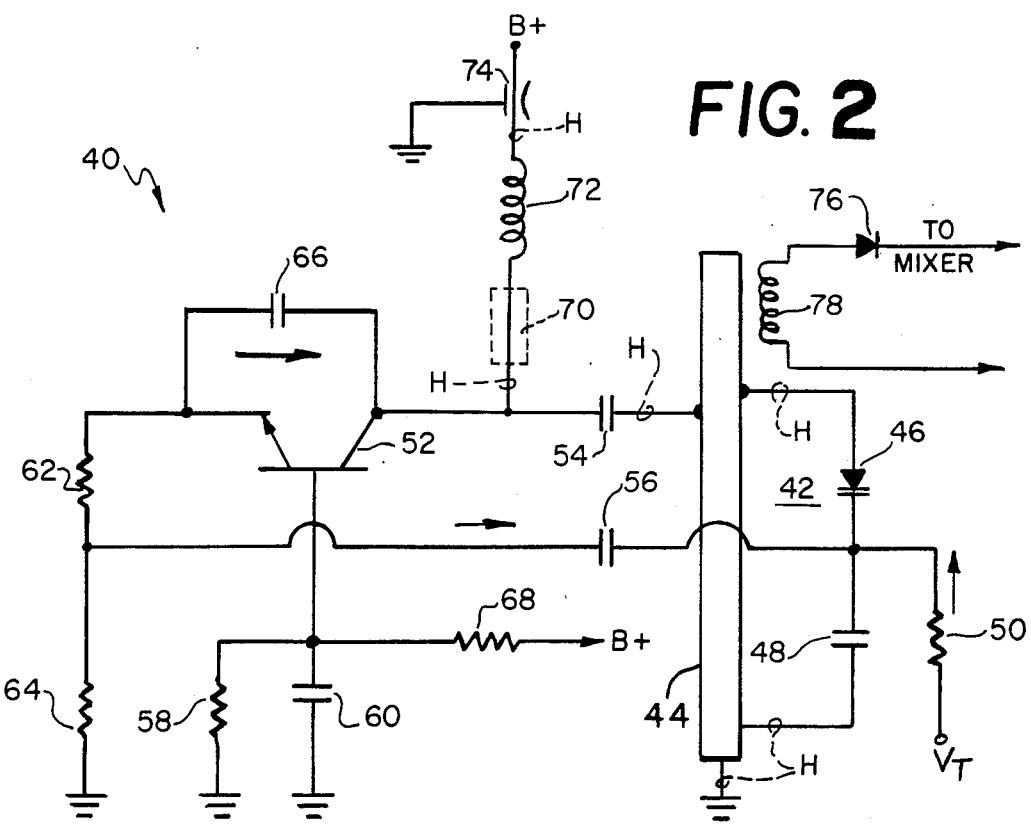
FIG. 2 is a simplified schematic diagram of a UHF oscillator comprised primarily of surface mounted devices in accordance with the present invention.
Figure 4:
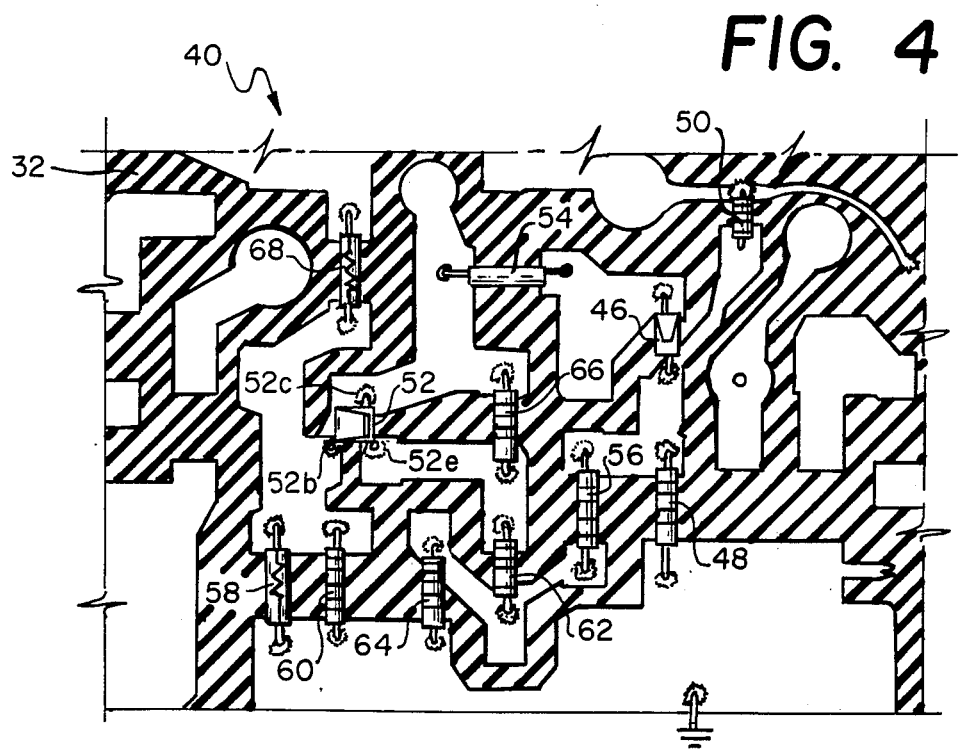
FIG. 4 is a planar view of a second, facing side of a printed circuit board upon which are positioned the various surface mounted devices utilized in the UHF oscillator of the present invention.

Referring to FIG. 2, there is shown a schematic diagram of a UHF oscillator circuit 40 in accordance with the present invention. FIG. 2 includes a plurality of generally circular elements shown in dotted line form and designated by the letter "H". Each of the elements H represents an aperture within the circuit board 32 of FIG. 1. Through each of these apertures a conductive lead is run to allow some of the components of the oscillator circuit 40 shown in FIG. 2 to be mounted on a first side of the PC board, with the remaining circuit elements located on a second, facing side of the PC board. Referring to FIGS. 3 and 4, there are shown various elements of the oscillator circuit 40 of FIG. 2 mounted respectively on the upper and lower facing surfaces of the PC board 32. Thus, those components which are positioned on the upper surface of the PC board 32 are illustrated in the planar view of FIG. 3 and are disposed within the oscillator compartment 22 of the metal frame 20. Similarly, those components of the oscillator circuit positioned on a lower surface of the PC board 32 are illustrated in FIG. 4 which is a planar view of the lower surface of the PC board. In FIG. 4, the nonconducting or insulating portions of the lower surface of the PC board 32 are designated by the parallel, diagonal lines illustrated therein. The conductive portions of the lower surface of the PC board 32 are represented by the clear or unmarked portions thereof. Each of the components shown in FIG. 4 is of the surface mounted, or leadless, type with the respective end terminals thereof coupled to an appropriate conductive portion of the PC board 32 in a conventional manner such as by soldering. The surface mounted components shown in FIG. 4 are coupled to the conventional discrete components illustrated in FIG. 3 by appropriate conductive leads extending from these latter components and through the aforementioned apertures within the PC board 32 as described below. The configuration and operation of the UHF oscillator circuit 40 schematically illustrated in FIG. 2 is described in detail in the following paragraphs.

Referring to FIG. 2, there is shown a schematic diagram of a UHF oscillator circuit 40 in accordance with the present invention. The oscillator circuit 40 includes a tunable tank circuit 42 comprised of an inductive line 44, a varactor diode 46, and a capacitor 48. To the tank circuit 42 is provided a tuning voltage $V_T$ via a resistor 50 from a tuning voltage source (not shown). The tuning voltage $V_T$ is provided to the cathode of the varactor diode 46 for controlling the voltage thereacross and to allow the capacitance within the tank circuit 42 to be adjusted as desired in tuning the tank circuit over a range of frequencies. In this manner, the tank circuit 42 may be tuned to a particular frequency corresponding to a desired channel. The inductive line 44 is electromagnetically coupled to a coil 78 in circuit with a mixer diode 76. The output of the circuit comprised of the coil 78 and the mixer diode 76 is provided to a mixer (not shown) in the UHF portion of the tuner for mixing the local oscillator frequency signal with a received RF signal in generating an intermediate frequency (IF) signal in a conventional manner.

The emitter terminal 52e of an NPN transistor 52 is coupled via a resistor 62 and a capacitor 56 to the cathode of the varactor diode 46 in the tank circuit 42. Similarly, the collector terminal 52c of transistor 52 is coupled via capacitor 54 to the inductive line 44. The junction of resistor 62 and capacitor 56 is coupled via resistor 64 to neutral ground potential. The base terminal 52b of transistor 52 is coupled to a source of B+ voltage via resistor 68 and is further coupled to neutral ground potential via the parallel arrangement of resistor 58 and capacitor 60. The B+ voltage provided to the base terminal 52b of transistor 52 renders the transistor conductive with base-emitter current flowing therein due to the biasing effect of resistor 62. The current flowing through the transistor 52 is fed back via the feedback capacitor 56 to the tank circuit 42 which, in turn, provides a feedback signal via capacitor 54 to the collector terminal 52c of transistor 52 causing the transistor to oscillate at the frequency to which the tank circuit 42 is tuned. Proper biasing for the base terminal 52b of transistor 52 is provided by resistors 58 and 68.

The UHF oscillator circuit 40 is driven by a B+ voltage coupled via the serial arrangement of a grounded filter capacitor 74, a choke 72, and a ferrite bead 70 to the junction of the collector 52c of transistor 52 and capacitor 54. The choke 72 permits the B+ input voltage to be provided to the oscillator circuit 40 without loading the tank circuit 42 and preventing it from oscillating. The ferrite bead 70 serves as a filter in suppressing oscillations below the UHF band by providing a low frequency AC resistance in the oscillator circuit. By incorporating a higher ratio varactor diode 46 within the tank circuit 42 an increased tuning range may be realized in the UHF oscillator circuit 40. However, the use of a higher ratio varactor diode in the tuned circuit tends to suppress lower frequency oscillation. In order to facilitate low frequency oscillation of the UHF oscillator circuit 40, the capacitance of the feedback capacitor 56 is increased. However, this results in higher frequency resonances in the feedback loop which is compensated for by resistor 62 coupled between the emitter terminal 52e of transistor 52 and the feedback capacitor 56. Resistor 62 dampens out the higher frequency resonances in the oscillator feedback loop. In order to increase the feedback of the surface mounted transistor 52, an external feedback capacitor 66 is coupled between its emitter terminal 52e and collector terminal 52c. The feedback across transistor 52 via capacitor 66 eliminates oscillator damping which occurs at lower frequencies arising primarily from the use of surface mounted devices in the oscillator circuits.

Referring specifically to FIG. 3, a metallic trimmer element 80 is shown mounted to the outer wall 24 of the oscillator compartment 22 and positioned adjacent to the line 44. By manually adjusting the position of the trimmer element 80 relative to the line 44, the location of the ground plane relative to the line may be established as desired. This selective positioning of the ground plane with respect to the line 44 allows the inductance of the line and the impedance of the tank circuit 42 to be adjusted for optimum operation of the UHF oscillator. In a preferred embodiment, one of the leads of the mixer diode 76 comprises the coil 78 electromagnetically coupled to the line 44. Proper adjustment of the relative positions of the coil 78 and the line 44 permits electromagnetic coupling between these elements to be optimized. In general, the lead of the mixer diode 76 which serves as the coil 78 is aligned generally parallel to and along the length of the line 44 to provide maximum coupling therebetween and to maximize signal injection to the mixer (not shown).

There has thus been shown a UHF local oscillator circuit comprised primarily of surface mounted devices. The inherently low Q values characteristic of the surface mounted, or chip, components is compensated for by a feedback arrangement which not only substantially increases the Q value of the oscillator, but also permits the oscillator to be tuned over a frequency range in excess of one octave.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. A tunable UHF oscillator circuit positioned on first and second facing sides of a printed circuit board having a plurality of apertures therein, said UHF oscillator circuit comprising:

a first plurality of leadless surface mounted components automatically positioned in circuit on the first side of the printed circuit board, wherein said first plurality of components include a transistor and are characterized as having low Q values;

a second plurality of lead-mounted components positioned in circuit by hand on the second side of the printed circuit board and connected in circuit with said first plurality of components by means of a plurality of leads extending from each of said second plurality of components and through the apertures of the circuit board;

a tunable tank circuit coupled to said leadless transistor and responsive to a tuning voltage provided thereto;

first feedback means including a leadless surface mounted capacitor coupled across a collector and an emitter of said leadless transistor for facilitating oscillation of said transistor at low UHF frequencies;

second feedback means coupling the emitter of said transistor to said tunable tank circuit for further facilitating oscillation of said transistor, wherein said first and second feedback means compensate for the low Q values of said leadless surface mounted components; and resistive means coupled between the emitter of said transistor and said second feedback means for providing isolation between said first and second feedback means in dampening out higher frequency resonances in said UHF oscillator circuit.

2. The UHF oscillator circuit of claim 1 wherein said second feedback means includes a leadless surface mounted capacitor.

3. The UHF oscillator circuit of claim 1 wherein said second plurality of lead-mounted components includes a choke coupled in series with a resistive ferrite bead and wherein said choke and said ferrite bead are coupled to said transistor for providing an input voltage thereto.

4. The UHF oscillator circuit of claim 3 wherein said tunable tank circuit includes a lead-mounted inductive line and wherein said inductive line, said choke, and said resistive ferrite bead comprise all of said second plurality of lead-mounted components with the remaining components of said UHF oscillator circuit comprised of said first plurality of leadless surface mounted components.

* * * * *